United States Patent
Dykstra

(10) Patent No.: US 7,449,929 B2
(45) Date of Patent: Nov. 11, 2008

(54) AUTOMATIC BIAS ADJUSTMENT FOR PHASE-LOCKED LOOP CHARGE PUMP

(75) Inventor: Jeffrey A. Dykstra, Palatine, IL (US)

(73) Assignee: Motorola, Inc, Schaumburg, IL (US)

( * ) Notice: Subject to any disclaimer, the term of this patent is extended or adjusted under 35 U.S.C. 154(b) by 38 days.

(21) Appl. No.: 11/672,611

(22) Filed: Feb. 8, 2007

(65) Prior Publication Data
US 2008/0191758 A1    Aug. 14, 2008

(51) Int. Cl.
*H03L 7/06* (2006.01)
(52) U.S. Cl. ....................... 327/157; 327/148
(58) Field of Classification Search ................. 327/148, 327/157
See application file for complete search history.

(56) References Cited

U.S. PATENT DOCUMENTS

| | | | |
|---|---|---|---|
| 5,140,196 A * | 8/1992 | Shepherd | 326/63 |
| 5,629,650 A | 5/1997 | Gersbach et al. | |
| 5,783,972 A | 7/1998 | Nishikawa | |
| 5,939,949 A | 8/1999 | Olgaard et al. | |
| 6,327,319 B1 | 12/2001 | Hietala et al. | |
| 6,329,882 B1 | 12/2001 | Fayneh et al. | |
| 7,170,322 B2 | 1/2007 | Gonzalez et al. | |
| 2006/0066359 A1 | 3/2006 | Tso et al. | |

* cited by examiner

*Primary Examiner*—Lincoln Donovan
*Assistant Examiner*—Patrick O'Neill

(57) ABSTRACT

A charge pump (140) having a differential current amplifier with a current source (151) that sources output current (155) in response to a first bias point (141), and a current sink (152) that sinks current in response to a second bias point (142) is provided. The charge pump includes a first level translator (131) that monitors a high range of an output voltage (156) of the differential current amplifier and self-adjusts the first bias point to extend the output voltage to a higher range, and a second level translator (132) that monitors a low range of the output voltage of and self-adjusts the second bias point to extend the output voltage to a lower range. The charge pump keeps the output current constant between the higher range and the lower range. A sensing transistor increases an output impedance of the differential current amplifier and reduces output loading.

16 Claims, 5 Drawing Sheets

AUTOMATIC BIAS ADJUSTMENT FOR PHASE-LOCKED LOOP CHARGE PUMP

FIELD OF THE INVENTION

The embodiments herein relate generally to phase-frequency detectors and more particularly to charge pump phase-frequency detectors used in phase lock loops.

BACKGROUND

High-performance phase-locked loops (PLLs) require accurate sensing and correction of a phase and frequency error between a reference clock signal and a feedback clock signal. Typically, a PLL includes a phase-frequency detector (PD), a charge pump, a loop filter, a voltage-controlled oscillator (VCO), and optionally a frequency divider. The PD senses the phase and frequency error and generates timing signals, which are used to generate an output current in the charge pump. The timing signals can consist of up pulses or down pulses that the charge pump receives to increase or decrease the output current over time. These currents are then integrated by a loop filter to create a control voltage, which is input to the VCO. The control voltage adjusts the frequency of the VCO to generate an output signal that is in phase and having a same frequency as the reference clock signal. The output signal can be fed back through the frequency divider to generate the feedback clock signal. Ideally, a plot of the control voltage as a function of the phase error should produce a linear response over an operating cycle where the PLL operates as expected.

Conventional charge pumps have current sources and current sinks along with switching devices used to control current flows through the current sources and current sink. The charge pump receives the timing signals, such as the up pulses and down pulses, and switches these switching devices on or off to change the output current of the charge pump. For example, when the feedback clock signal leads the reference clock signal, the current sink reduces output current in response to the down pulses so that the control voltage is decreased. The decrease in output voltage over time mitigates the phase lag. When the reference clock signal leads the feedback clock signal, the current source increases the output current in response to the up pulses so that the control voltage is increased. The increase in output voltage over time mitigates the phase lag. When the PLL is locked, the current source and the current sink keep the output current constant so that the control voltage does not change, and accordingly, the output signal stays in phase with the reference clock signal.

The charge pump generally operates at a nominal supply voltage. The supply voltage provides power to the transistors in the charge pump, which provide the output current to the VCO. The transistors generally have a nominal device rating that is below the supply voltage. Accordingly, the output voltage range of the charge pump is generally limited by the voltage operating ranges of the transistors. Consequently, the output voltage range is generally lower than the supply voltage. Attempting to increase the output voltage of the charge pump to a greater range by increasing the supply voltage can cause the transistors to break down.

Current prior art methods to increase the output voltage range of a charge pump generally introduce a loading on the charge pump which decreases output impedance of the charge pump. The decrease in impedance reduces the phase lock accuracy of the PLL. Moreover, the VCO gain is largely dependent on the output voltage range. The VCO, which receives the output current of the charge pump, must generally compensate for the small output voltage range of the charge pump. In practice, a conventional VCO compensates for the small output voltage range of a charge pump by providing a higher gain which can introduce noise, thereby increasing phase errors and sacrificing phase lock accuracy. A need therefore exists for increasing the output voltage range of a charge pump while maintaining linear operation without loading the output of the charge pump.

SUMMARY

One embodiment is a charge pump that supplies an output current to a voltage controlled oscillator of a phase locked loop. The charge pump includes a current amplifier that sources or sinks current in accordance with at least one bias point of the charge pump to produce the output current, and at least one level translator connected to the current amplifier that detects when an output voltage of the current amplifier exceeds a predetermined range due to the output current, and self-adjusts the at least one bias point to extend the output voltage range of the charge pump. The at least one level translator can include a first level translator that monitors the output voltage of the current amplifier and self-adjusts a first bias point of a current source that sources the output current, wherein the first level translator increases the current sourcing in response to receiving an up pulse signal, and a second level translator that monitors the output voltage of the charge pump and self-adjusts a second bias point of a current sink that sinks the output current, wherein the second level translator increases the current sinking in response to receiving a down pulse signal.

The current amplifier includes at least one bi-polar junction (BJT) transistor having a collector connected to the output voltage, a base connected to the at least one level translator, and an emitter tied to the current amplifier wherein the level translator senses a change in a base voltage when the output voltage at the collector exceeds the predetermined range. The at least one level translator assesses a change in a base current due to the effects of the output current on output voltage, and updates the bias point to change the output current by adjusting a base voltage of a transistor coupled to the current amplifier. The at least one BJT increase an output impedance of the differential current amplifier due to a high input impedance of a BJT collector. The at least one BJT detects when the output voltage exceeds the predetermined range without loading an output of the charge pump. A comparator in the level translator includes a clocked latch that provides hysteresis, increases a gain of the comparator, and holds a state of the comparator to implement a bias scheme that changes in response to the charge pump output voltage.

Another embodiment is a charge pump that supplies an output current to a voltage controlled oscillator of a phase locked loop and having an output voltage that varies in accordance with the output current. The charge pump includes a differential current amplifier having a current source that sources current to the output current in response to a first bias point, and a current sink that sinks current from the output current in response to a second bias point. The charge pump also includes a first level translator, coupled to the current source, that monitors a high range of the output voltage of the differential current amplifier and self-adjusts the first bias point to extend the output voltage to a higher range, and a second level translator, coupled to the current sink, that monitors a low range of the output voltage of the differential current amplifier and self-adjusts the second bias point to extend the output voltage to a lower range. The first level translator senses a start of a current source break down at a high output voltage, and the second level translator senses a start of a current sink break down at a low output voltage. The charge pump keeps the output current constant between the higher range and the lower range Another embodiment is a phase locked loop, comprising a phase detector that evaluates a phase and frequency error between a reference clock signal and a feedback divider signal and generates a timing signal consisting of up pulses and down pulses, a charge pump coupled to the phase detector that receives the timing signal and generates an output current in accordance with the up pulses and down pulses. The charge pump comprises a current source that sources current to the output current in response to a first bias point, a current sink that sinks current from the output current in response to a second bias point. The phase locked loop further comprises a first level translator, coupled to the current source, that monitors a high range of an output voltage of the charge pump and self-adjusts the first bias point to extend the output voltage to a higher range, and a second level translator, coupled to the current sink, that monitors a low range of the output voltage of charge pump and self-adjusts the second bias point to extend the output voltage to a lower range. The phase locked loop further comprises a loop filter coupled to the charge pump that filters the output current and that generates an output voltage, a voltage controlled oscillator coupled to the loop filter that receives the output voltage and generates an output clock signal having a phase and frequency of the reference clock signal, and a feedback divider coupled to the voltage controlled oscillator that produces the feedback divider signal from the output clock signal and provides the feedback divider signal to the phase detector. A plurality of level translators can be used for detecting when the output voltage exceeds a predetermined range, and adjusting a bias point of a plurality of current amplifiers to extend the output voltage to multiple ranges.

The first level translator includes a first comparator that monitors a change in the first bias point by determining when a base voltage of a first transistor connected to the output voltage and the first level translator exceeds a first reference voltage, and the second level translator includes a second comparator that monitors a change in the second bias point by determining when a base voltage of a second transistor connected to the output voltage and the second level translator falls below a second reference voltage. The first level translator receives as input the first bias point and adjusts the first bias point to extend the output voltage to an upper supply voltage, and the second level translator receives as input the second bias point and adjusts the second bias point to extend the output voltage to a lower supply voltage of the charge pump to prevent charge pump break down.

BRIEF DESCRIPTION OF THE DRAWINGS

The features of the system, which are believed to be novel, are set forth with particularity in the appended claims. The embodiments herein, can be understood by reference to the following description, taken in conjunction with the accompanying drawings, in the several figures of which like reference numerals identify like elements, and in which:

DETAILED DESCRIPTION

Figure 1:
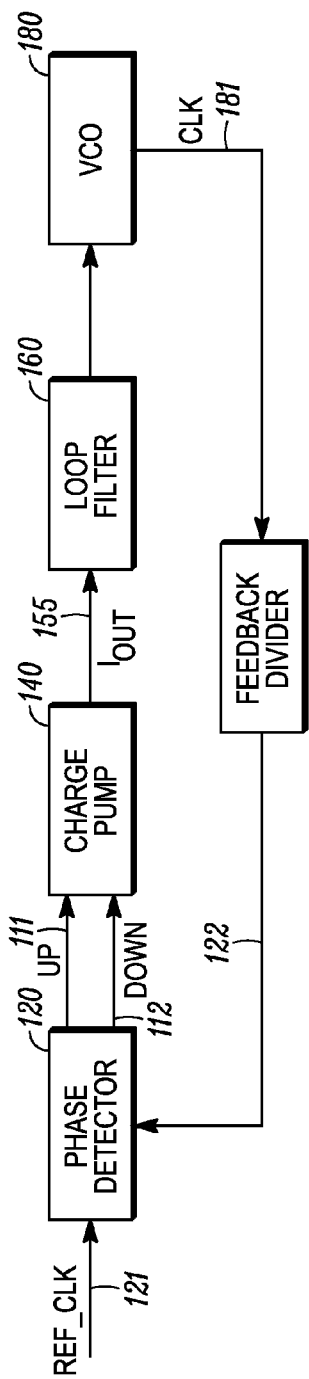
FIG. 1 is an electrical block diagram of a phase lock loop circuit in accordance with the preferred embodiment of the present invention.

While the specification concludes with claims defining the features of the embodiments of the invention that are regarded as novel, it is believed that the method, system, and other embodiments will be better understood from a consideration of the following description in conjunction with the drawing figures, in which like reference numerals are carried forward.

As required, detailed embodiments of the present method and system are disclosed herein. However, it is to be understood that the disclosed embodiments are merely exemplary, which can be embodied in various forms. Therefore, specific structural and functional details disclosed herein are not to be interpreted as limiting, but merely as a basis for the claims and as a representative basis for teaching one skilled in the art to variously employ the embodiments of the present invention in virtually any appropriately detailed structure. Further, the terms and phrases used herein are not intended to be limiting but rather to provide an understandable description of the embodiment herein.

The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "self-adjust" as used herein, is defined as monitoring a signal and adjusting a device generating the signal in response to the monitoring. The term "self-adjusting device" is defined as a device that monitors a bias point and automatically adjusts the bias point to provide a device operation within a specified operating range. The term "predetermined range" is defined as a range that is set by a circuit designer or provided as an adjustable user parameter FIG. 1 is a simplified block diagram of a phase locked loop (PLL) 100 adapted to maintain a fixed relationship between the phase and frequency of signal Clk 181 and signal Ref_Clk 121 operating in accordance with an embodiment of the invention. PLL 100 includes, among other components, phase detector 120, charge pump 140, loop filter 160, voltage controlled oscillator (VCO) 180, and an optional feedback divider 190. Ref_Clk 121 is a highly stable frequency signal used as an input reference to the PLL 100. The phase detector 120 compares the reference signal, Ref_Clk 121, to a divided down VCO frequency 122 generated by the frequency divider 190. The phase detector 120 evaluates a phase difference between Ref_Clk 121 and the divided down VCO frequency 122. Briefly, the charge pump 140 of this invention can automatically extend its output voltage range if the output current Iout 155 produce results in an output voltage that exceeds a predetermined operating range.

Phase Detector (PD) 120 receives signals Ref_Clk and Clk, and in response, generates a sequence of up pulses 111 and down pulses 112 that correspond to the phase difference. Charge pump 140 receives the sequence of up pulses 111 and down pulses 112, and in response, generates and delivers to the loop filter 160 a current signal, Iout 155, whose magnitude varies depending on the number of up pulses 111 and down pulses received. Loop filter 160 filters out spurious components of current signal (Iout 155) and delivers a time-averaged filtered voltage signal to VCO 180. The VCO 180 controls a phase and frequency Clk 181 as a function of the time-averaged filtered voltage signal. Once in a locked state, the phase and frequency of signal Clk is locked to Ref_Clk.

Briefly, if signal Ref_Clk 121 leads signal Clk 181 in phase—indicating that the VCO 180 is running relatively slowly—the phase detector 120 generates more up pulses 111 to cause the charge pump 140 to increase its output current, Iout 155, until VCO 18 achieves an oscillation frequency at which signal Clk is frequency-locked and phase-locked with signal Ref_Clk. If, on the other hand, signal Ref_Clk 121 lags signal Clk 181 in phase—indicating that the VCO is running relatively fast—the phase detector 120 generates more down pulses 112 to cause charge pump 140 to reduce its output current, Iout 155, until VCO 180 achieves an oscillation frequency at which signal Clk 181 is frequency-locked and phase-locked with signal Ref_Clk 121. Signal Clk 181 is considered to be locked to signal Vref 121 if its frequency is within a predetermined frequency range of signal Ref_Clk, with respect to the frequency divided signal 122. Signal Clk 181 is considered to be out-of-lock with signal Ref_Clk 121 if its frequency is outside the predetermined frequency range of signal Ref_Clk, with respect to the frequency divided signal 122.

Figure 2:
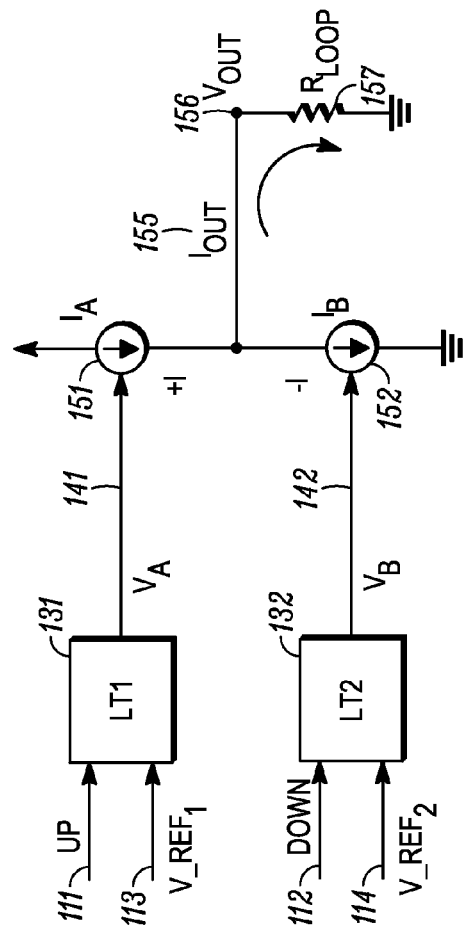
FIG. 2 is a charge pump that self biases in accordance with the preferred embodiment of the present invention.

Referring to FIG. 2, a simplified block diagram of the charge pump 140, is shown in accordance with an embodiment of the invention. Notably, the simplified block diagram is a high level illustration that can include more components than those shown and is not limited to the arrangement or components shown. The charge pump 140 includes a first level translator (LT1) 131 that receives as input the up pulses 111 from the phase detector 120, and a second level translator (LT2) 132 that receives as input the down pulses 112 from the phase detector 120. LT1 (131) and LT2 (132) also receive as input V_ref 113 which establishes a reference voltage to the level translators. The charge pump 140 also includes a differential current amplifier 150 that generates Iout 155. The current amplifier 150 sources current or sinks the current Iout 155 in proportion to the number of up pulses 111 or down pulses 112 received.

The level translators LT1 131 and LT2 132 convert a sequence of pulses to voltage bias points $V_A$ 141 and $V_B$ 142, respectively. The voltage bias points $V_A$ 141 and $V_B$ 142 are applied to the current amplifier 150 and establish the amount of current that is sourced or sunk to the output current, Iout 155. For example, LT1 131 translates a sequence of up pulses 111 to a first bias point $V_A$ 141 that is input to current source $I_A$ 151. In one arrangement, the bias point $V_A$ 141 is a voltage that is applied to a base of a BJT and determines the amount of current sourced by $I_A$ 151. In response to receiving up pulses 111, LT1 131 increases $V_A$ 141 which increases the current $I_A$ 151. The increase in current $I_A$ 151 sources more current to Iout 155 thereby increasing the output voltage 156 of the charge pump 140

Similarly, LT2 132 translates a sequence of down pulses 112 to a second bias point $V_B$ 142 that is input to a current source $I_B$ 152. The bias point $V_B$ 142 can be a voltage applied to a base of a BJT that determines the amount of current sunk by $I_B$ 152. In response to receiving down pulses 112, LT2 increases $V_B$ 142 which increases the current $I_B$ 152. The increase in $I_B$ 152 sinks more current from Iout 155 thereby decreasing the output voltage 156 of the charge pump 140. Notably, the output voltage 156 is inherently related to the output current Iout 155 due to the loading of the loop filter 160 on the charge pump 140. The output current Iout 155 produces an output voltage 156 that depends on the input resistance 157 of the loop filter 160. The output voltage 156 is directly related to the output current Iout 155 produced by the charge pump 140.

Briefly, LT1 131 and LT2 132 together detect when an output voltage 156 of the charge pump 140 is out of a predetermined range, and in response, change a bias condition of the charge pump 140. The level translators LT1 131 and LT2 132 self-adjust voltage bias points $V_A$ 141 and $V_B$ 142 in accordance with the output voltage 156 of the charge pump 140. Broadly stated, the level translators LT1 131 and LT2 132 monitor the output voltage 156 at the bias points $V_A$ 141 and $V_B$ 142 and adjust the bias points $V_A$ 141 and $V_B$ 142 of the current amplifiers $I_A$ 151 and $I_B$ 152 to maximize an operating range of the charge pump 140. More specifically, the level translators perform the steps of generating a bias point to change an output current 155, assessing a change in base current due to the effects of the output current on output voltage, and self adjusting (e.g. updating) a base voltage of a transistor coupled to a current source or current sink. For example, LT1 131 increases $V_A$ 141 in response to up signals 111, monitors the change in output voltage 156 due to an increase in a base current source $I_A$ 151, and then self-updates $V_A$ 141 if the increase in current source exceeds an upper predetermined threshold, V_ref1 113. Similarly, LT2 132 increases $V_B$ 142 in response to down signals, monitors the change in output voltage due to an increase in a base current sink $I_B$ 152, and then self-adjusts if the increase in current sink exceeds a lower predetermined threshold, V_ref2 114. Notably, LT1 and LT2 each set a bias point, monitor a change in base current, and then self-adjust the bias point in response to base current conditions associated with the output voltage 156.

Figure 3:
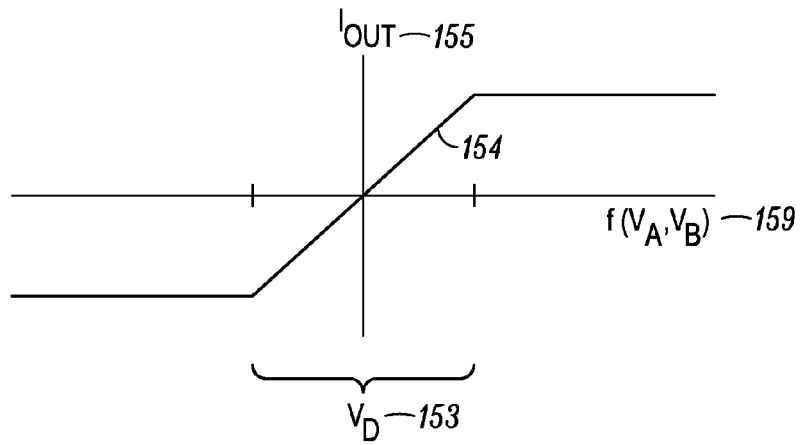
FIG. 3 is a plot diagram of average output current supplied by the charge pump as a function of bias points, in accordance with the preferred embodiment of the present invention.

Referring to FIG. 3, an exemplary plot diagram 200 of the output current Iout 155 as a function 159 of bias points $V_A$ 141 and $V_B$ 142 is shown. The exemplary plot diagram is merely an illustration for a particular current source configuration and is not restricted to the range limits shown. For example, the output current Iout 155 can deviate more or less than +I or −I from a reference current source, and is not limited to the origin. The bias points $V_A$ 141 and $V_B$ 142 determine how much current is sourced or sunk to Iout 155. For example, more output current, Iout 155, is sourced when $V_A$ 141 increases, up to +I, thereby increasing the output voltage 156. More output current, Iout 155, is sunk when $V_B$ 142 increases, down to −I, thereby decreasing the output voltage 156.

Notably, the output current Iout 155 is a function of the bias points $V_A$ 141 and $V_B$ 142 when the bias points are within an input voltage operating range 153. The output current, Iout 155, is also constant within a linear operating range 154. Within the linear region 154, the current amplifier 150 operates within normal operating limits. Briefly, referring back to FIG. 2, LT1 131 monitors the output voltage 156 by sensing the amount of current sourced by $I_A$ 151. If the amount of current sensed exceeds a predetermined upper range, LT1 131 adjusts the bias point $V_A$ 141 to extend an upper voltage limit of the charge pump 140. The biasing prevents the current amplifier 150 from operating outside the upper designed limits. Similarly, LT2 monitors the output voltage 156 by sensing the amount of current sunk by $I_B$ 152. If the amount of current sensed exceeds a predetermined lower range, LT2 132 adjusts the bias point $V_B$ 142 to extend a lower voltage limit of the charge pump 140. The biasing prevents the current amplifier 150 from operating outside the lower designed limits.

An output compliance range (e.g. output voltage operating range 156) of the charge pump 140 is important for achieving phase lock in the PLL 100. In general, a good compliance range is associated with a large output voltage range 156 of the charge pump 140. A poor compliance range is associated with a small output voltage 156 range of the charge pump 140. A large voltage output range 156 is preferable since this determines a component transfer gain of the PLL 100. During operation, the charge pump 140 keeps the output current Iout 155 constant over a wide output voltage range which corresponds to the linear region 154 of the plot diagram of FIG. 2. Moreover, a large output voltage range 156 means that a gain of the VCO 180 can be reduced, which reduces a noise associated with the input port of the VCO 180. For example, a larger output voltage range 156 that is applied to an input of the VCO 180 requires smaller incremental VCO gains since the range of the input is wider. In such regard, due to the wider output range of the charge pump 140, the VCO 180 is subject to less noise injection at the input which results in a tighter phase tracking.

Recall, the output voltage is generated in response to the phase error detected by the phase detector 120. The charge pump sources more current in response to a phase lag, and sinks more current in response to a phase lead. When the PLL 100 is in lock, the amount of current remains constant. As an example, referring back to FIG. 2, when the PLL 100 is in lock, neither $I_A$ 151 or $I_B$ 152 may source or sink current. Accordingly, as shown in FIG. 3, with the operating point at the origin, the change in output current of the charge pump 140 is zero. This keeps the output voltage at zero and keeps the VCO 180 at a fixed frequency. Recall, the VCO 180 changes output frequency in accordance with a positive or negative input voltage which is established by the output current Iout 155. With respect to FIG. 2, when the output current Iout 155 increases, the output voltage 156 increases, thereby increasing the output frequency of the VCO 180. When the output current Iout 155 decreases, the output voltage 156 decreases, thereby decreasing the output frequency of the VCO 180.

Figure 4:
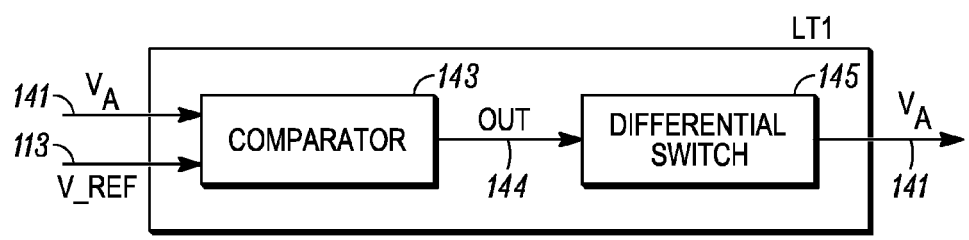
FIG. 4 is a pump-up level translator for monitoring and adjusting a high voltage bias point in accordance with the preferred embodiment of the present invention.

Referring to FIG. 4, a simplified block model of level translator (LT1) 131 is shown. LT1 can include a comparator 143 that receives as input up pulses 111 and V_ref 113. The comparator 143 produces an output signal out 144 that is input to a differential switch 145 which adjusts the bias point $V_A$ 141. V_ref 113 provides hysteresis to the differential switch 145 for maintaining the adjusted bias point $V_A$ 141. That is, the comparator 143 implements a bias scheme that changes in response to the charge pump output voltage. Notably, LT1 131 receives as input the bias point $V_A$ 141 and V_ref1 113 to self-adjust VA 141. As will be explained ahead, bias point $V_A$ 141 is a function of the output voltage 156 and output current 155 (See FIG. 2). In particular, $V_A$ 141 will increase when the output voltage 156 exceeds a predetermined output voltage range due to the sourced output current $I_A$ 151. The comparator 143 identifies when $V_A$ 141 exceeds V_ref 113, and in response, changes the bias point VA 141 to keep the charge pump 140 in a predetermined operating range. This allows LT1 131 to enable a high voltage range up to the supply voltage. This supply voltage may exceed the nominal breakdown rating of the output device; i.e., $BV_{CEO}$ of the output BJT.

Figure 5:
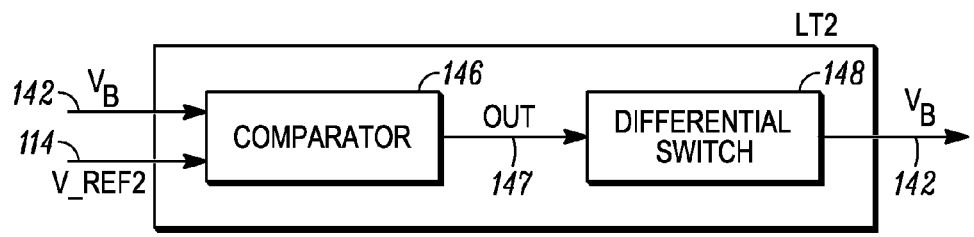
FIG. 5 is a pump-down level translator for monitoring and adjusting a low voltage bias point in accordance with the preferred embodiment of the present invention.

Referring to FIG. 5, a simplified block model of level translator (LT2) 132 is shown. LT2 can include a comparator 146 that receives as input down pulses 112 and V_ref2 114. The comparator 146 produces an output signal out 147 that is input to a differential switch 148 which adjusts the bias point $V_B$ 142. V_ref2 114 provides hysteresis to the differential switch 148 for maintaining the adjusted bias point $V_B$ 142. Notably, LT2 132 receives as input the bias point $V_B$ 142 and V_ref2 114 to self-adjust $V_B$ 142. As will be explained ahead, bias point $V_B$ 142 is also a function of the output voltage 156 and output current 155 (See FIG. 2). In particular, $V_B$ 142 will increase when the output voltage 156 exceeds a predetermined output voltage range due to the sunk output current $I_B$ 152. The comparator 146 identifies when $V_B$ 142 exceeds V_ref2 114, and in response, changes the bias point $V_B$ 142 to keep the charge pump 140 in a predetermined operating range. This allows LT2 132 to enable a low voltage range up to the negative supply voltage.

Broadly stated, comparator 143 determines when the high output voltage range of 156 increases $V_A$ 141 beyond a predetermined operating point, and comparator 146 determines when the low output voltage range of 156 increases $V_B$ 142 beyond a predetermined operating point. More specifically, LT1 (131) and LT2 (132) extend the output voltage range 156 of the charge pump 140 by sensing a start of a current source break down in $I_A$ 151 at a high output voltages and a start of a current sink break down in $I_B$ 152 at a low output voltages.

Figure 6:
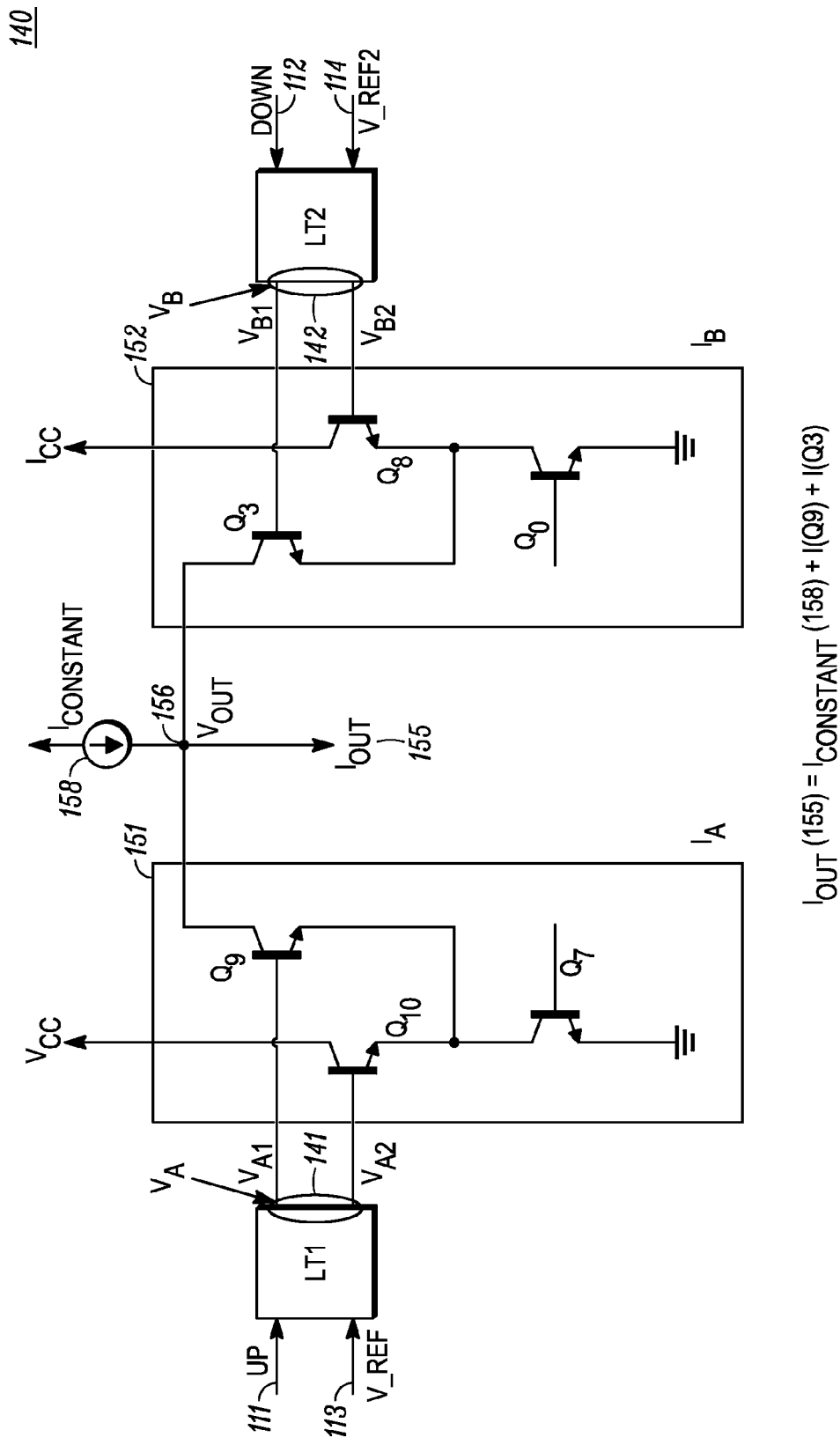
FIG. 6 is a more detailed schematic of a portion of the charge pump of FIG. 2 identifying output voltage sensor elements and corresponding bias points in accordance with the preferred embodiment of the present invention.

Referring to FIG. 6, a more detailed diagram of one portion of the charge pump 140 is shown. Notably, the charge pump 140 includes more components than those shown and is not limited to those shown or to the arrangement of the components shown. The charge pump 140 can consist of CMOS and BJT transistors manufactured using a BiCMOS Integrated Circuit (IC) process. In particular, only the components associated with a sensing of the output voltage 156, and an adjusting of the bias points $V_A$ 141 and $V_B$ 142 of the charge pump 140 are shown. As illustrated, the charge pump 140 includes LT1 131 receiving as input up pulses 111 and V_ref1 113, and LT2 132 receiving as input down pulses 112 and V_ref2 114. LT1 131 generates bias point $V_A$ 141 for sourcing current Iout 155 in response to the up pulses, and LT2 132 generates bias point $V_B$ 142 for sinking current Iout 155 in response to the down pulses. The output current Iout 155 is the sum of Iconstant 158 plus the current sourced by Q9 and the current sunk by Q10.

Bias point $V_A$ 141 comprises two voltage lines each applied separately to two transistors. $V_A$ 141 includes a first bias $V_{A1}$ applied to the base of Bi-Polar Junction (BJT) transistor Q9, and a second bias $V_{A2}$ applied to the base of Bi-Polar Junction (BJT) transistor Q10. Briefly, transistor Q9 monitors output voltage 156 by sensing a change in base current in Q9 due to Vout 156 becoming too high. Moreover, Q9 detects the change in output voltage 156 without loading the output of the charge pump 140. Notably, Q9 also serves as an impedance buffer between LT1 131 and the output voltage 156. Notably, the arrangement of Q9 as coupled to the output voltage 156 prevents the output voltage 156 from being directly coupled as input to the comparator 143 (FIG. 4) of LT1 131. The comparator 143 is generally not capable of measuring or monitoring the output voltage directly, since the output voltage at a high end or low end is generally beyond the range of either a BJT base of FET gate to withstand. Furthermore, Q9 provides a higher impedance buffer than a voltage divider with resistive elements. A voltage divider would draw current away from the output and cause spurious tones to be generated in the PLL 100. Furthermore, a voltage divider would reduce the output impedance of the charge pump 140 and reduce an accuracy of the current output, Iout 155.

Referring again to FIG. 6, $V_{A1}$ changes in accordance with the output voltage 156. That is, when the output voltage 156 exceeds a predetermined threshold, Iout 155 flows through the base of Q9, which is detected by LT1 131. Referring to FIG. 3, the comparator 143 detects a change in $V_{A1}$ when the output voltage 155 exceeds a predetermined range which can be set by the circuit designer or provided as an adjustable user parameter. In response, LT1 131 adjusts the bias point $V_A$ 141 to reduce the output current Iout 155 sourced. In particular, returning back to FIG. 6, LT1 131 adjusts the bias point $V_{A2}$ to Q10 which changes the amount of output current Iout 155. LT1 131 advantageously raises the base voltage of Q10 while lowering the base impedance to ensure the output voltage 155 can go as high as a high supply voltage of the charge pump 140 before the transistors Q9, Q10, and Q7 undergo a collector breakdown.

Bias point $V_B$ 142 comprises two voltage lines each applied separately to two transistors. $V_B$ 142 includes a first bias $V_{B1}$ applied to the base of Bi-Polar Junction (BJT) transistor Q3, and a second bias $V_{B2}$ applied to the base of Bi-Polar Junction (BJT) transistor Q8. Briefly, transistor Q3 monitors the output voltage 156 by sensing a change in base current of Q3 due to sourcing the output current Iout 155 too low. Moreover, Q3 detects the change in output voltage 155 without loading the output of the charge pump 140. In particular, $V_{B1}$ changes in accordance with the output voltage 155. That is, when the output voltage 156 falls below a predetermined threshold, Iout 155 flows through the base of Q3, which is detected by LT2 132. Referring to FIG. 4, the comparator 146 detects a change in $V_{B1}$ when the output voltage 155 falls below a predetermined range which can be set be the circuit designer or provided as an adjustable user parameter. In response, LT2 132 adjusts the bias point $V_B$ 142 to reduce the output current Iout 155 sunk. In particular, returning back to FIG. 6, LT2 132 adjusts the bias point $V_{B2}$ to Q8 which changes the amount of output current Iout 155. LT2 132 advantageously lowers the output voltage range while maintaining constant base current. $V_{B2}$ ensure2 that the output voltage 155 can go as low as a low supply voltage (or ground) of the charge pump 140 before the transistors Q3, Q8, and Q0 undergo collector saturation.

Figure 7:
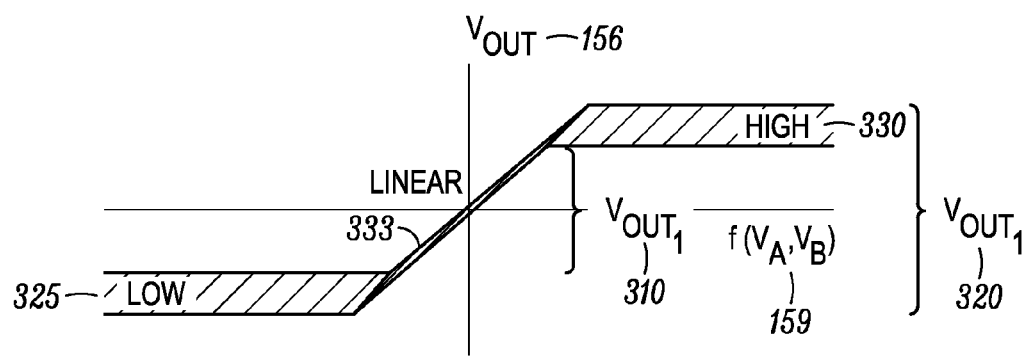
FIG. 7 is a plot diagram of an output voltage of the charge pump as a function of bias points in accordance with the preferred embodiment of the present invention.

Referring to FIG. 7, an exemplary plot diagram 200 of the output voltage 156 as a function 159 of bias points $V_A$ 141 and $V_B$ 142 is shown. Notably, the charge pump 140 adjusts the bias points $V_A$ 141 and $V_B$ 142 to extend a normal output voltage range $V_{out1}$ 310 to a larger output voltage range $V_{out2}$ 320. In effect, adjusting bias point $V_A$ 141 increases the output voltage to a higher range 330, and adjusting bias point $V_B$ 142 lowers the output voltage to a lower range 325. As previously noted, the compliance range of a charge pump 140 used as a phase detector in a phase locked loop 100 needs to be as large as possible. This can be true for charge pump designs that need to output a high output voltage using low voltage rating devices. As a practical example, the level translators LT1 131 and LT2 132 of FIG. 2 can extend the operating range of a charge pump to 12 volts using only nominal 3.6 volt devices. In such regard, the level translators can increase the output range of the charge pump 140 to ranges approximating a supply voltage instead of the nominal ratings of the devices in the charge pump 140. It should also be noted that the charge pump 140 can be designed to provide multiple ranges, beyond the two ranges (330 and 325) shown. For example, a third or fourth level translator (not shown) can be assigned for to a higher and lower desired range. Notably, each additional level translator can monitor a base voltage of a BJT whose collector is tied to the output voltage 156 and whose emitter is tied to a current amplifier. In such regard, each additional level translator can individually monitor a change in output voltage 156 and adjust a bias point of a current source or sink to the output current Iout 155. Each additional level translator can either extend a high range (e.g. 330) of the output voltage, or extend a low range (e.g. 325) of the output voltage. For example, a third level translator upon sensing a rise in output voltage can raise a base voltage of a current source to lower a base impedance of the current source and extend the output voltage to a higher range. A fourth level translator upon sensing a lowering in output voltage can raise a base voltage of a current sink to lower a base impedance of the current sink and extend the output voltage to a lower range. Moreover, the level translators, due to the arrangement of transistors Q9, Q10, Q7, Q3, Q8, and Q0 keep the charge pump 140 in a linear operating region 154 thereby maintaining constant current, Iout 155.

Figure 8:
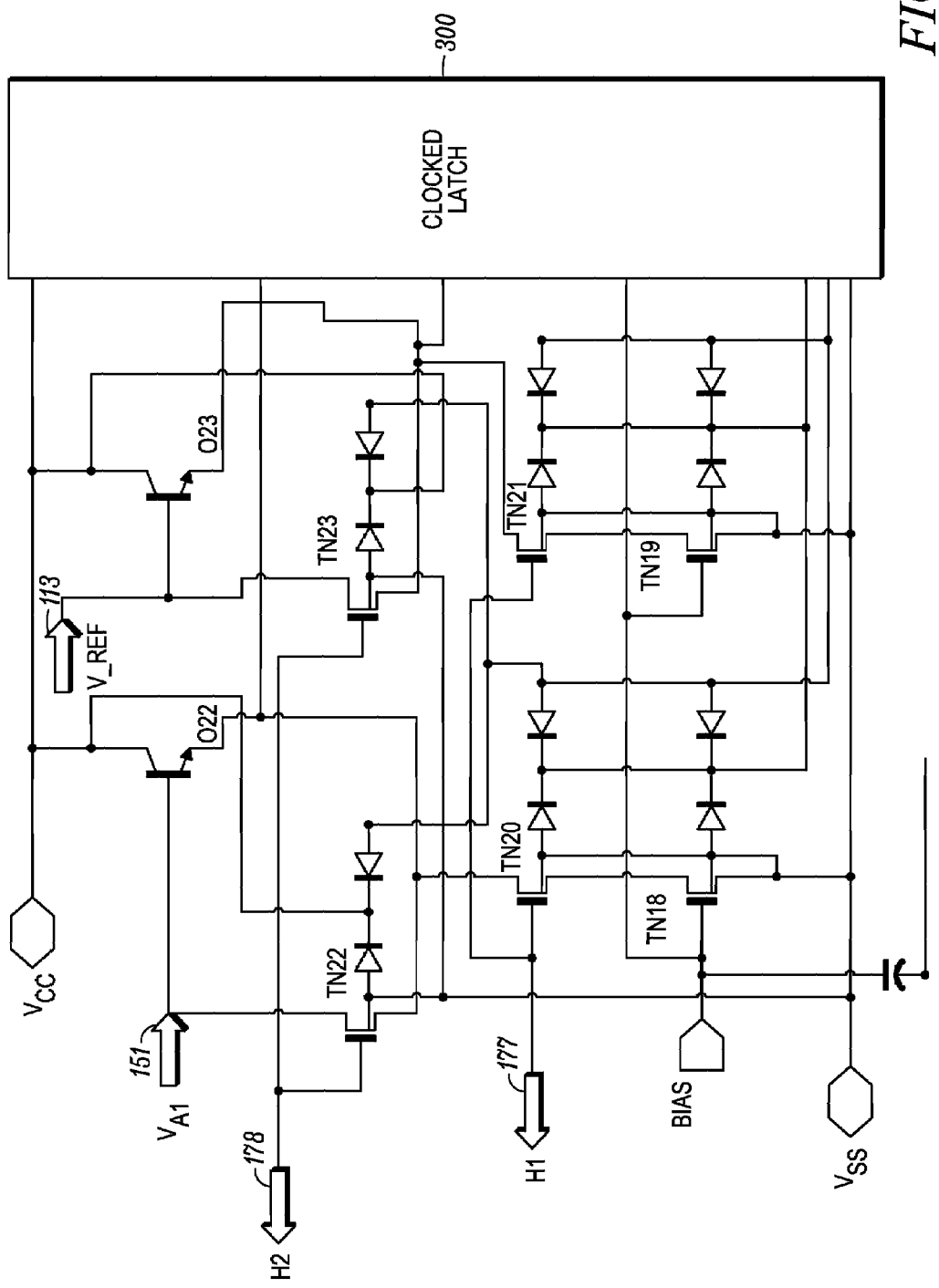
FIG. 8 is a more detailed schematic of a comparator of the level translator of FIG. 4 in accordance with the preferred embodiment of the present invention.

Referring to FIG. 8, a more detailed schematic of the one portion of the comparator 143 of FIG. 4 is shown. Notably, the same comparator design can be used in both level translators LT1 131 (FIG. 4) and LT2 132 (FIG. 5), albeit with different inputs. For example, comparator 143 of LT1 131 compares the input voltages $V_{A1}$ 151 (corresponding to first bias point $V_{A1}$ of $V_A$ 141) and V_ref 113. The comparison is carried over to a clocked latch 300 that produces output signals H1 177 and H2 178. The clocked latch 300 provides hysteresis to interchange states in accordance with the inputs $V_{A1}$ 151 and V_ref 113. The latch 300 increases a gain of the comparator 143 and holds a state of the comparator 143. Similarly, comparator 146 (See FIG. 5) of LT2 132 can compare the input voltage $V_{B1}$ (corresponding to first bias point $V_{B1}$ of $V_B$ 142 in FIG. 8) and V_ref 113 to produce its own set of latched output signals.

The comparator 143 can automatically adjust its input bias depending on a state of the output of the comparator 143 and the latch 300. Comparator 143 compares $V_{A1}$ 151 and V_ref 113. If $V_{A1}$ 151 is lower, Tn22 and Tn23 bypass emitter followers Q22 and Q23 which change the state of the clocked latch 300 outputs H1 177 and H2 178. The clocked latch 300 is phased such that the outputs H1 177 and H2 178 change when the current Iout 155 of the charge pump 140 changes. This allows the phase detector 120 to operate on a rising edge of the reference clock V_ref 113, and the comparator 143 to operate on a falling edge of V_ref 113. Thus any disturbances to the bias points $V_A$ 141 or $V_B$ 142 will occur when the charge pump 140 output current Iout 155 is off and the charge pump 140 is operating in steady state where glitches in Iout 155 do not effect a comparison between $V_{A1}$ 151 and V_ref 113 in the comparator 143. That is, the level translators LT1 and LT2 will only adjust the bias points $V_A$ 141 or $V_B$ 142 when the charge pump 140 is not sourcing or sinking current. In such regard, any transients associated with the bias adjustment are not amplified by the charge pump 140 since the charge pump is not sourcing or sinking current. The transients therefore do not adversely affect the phase tracking performance of the VCO since the charge pump is not activated during these times. Recall, the charge pump 140 receives a sequence of up pulses and down pulses (e.g. zeros and ones). The level translators intentionally update the bias points only when the pulses are zero and the charge pump is not sourcing or sinking current to prevent an unwanted introduction of transients to the VCO.

Where applicable, the present embodiments of the invention can be realized in hardware, software or a combination of hardware and software. Any kind of computer system or other apparatus adapted for carrying out the methods described herein are suitable. A typical combination of hardware and software can be a mobile communications device with a computer program that, when being loaded and executed, can control the mobile communications device such that it carries out the methods described herein. Portions of the present method and system may also be embedded in a computer program product, which comprises all the features enabling the implementation of the methods described herein and which when loaded in a computer system, is able to carry out these methods.

While the preferred embodiments of the invention have been illustrated and described, it will be clear that the embodiments of the invention are not so limited. Numerous modifications, changes, variations, substitutions and equivalents will occur to those skilled in the art without departing from the spirit and scope of the present embodiments of the invention as defined by the appended claims.

What is claimed is:

1. A charge pump that supplies an output current to a voltage controlled oscillator of a phase locked loop, the charge pump comprising:

a current amplifier that sources or sinks current in accordance with at least one bias point of the charge pump to produce the output current; and at least one level translator connected to the current amplifier; and wherein the at least one level translator includes:
a comparator that receives a base voltage and a voltage reference as input and produces a differential output signal; and
a differential switch that receives the differential output signal and updates the bias point in accordance with the differential output signal.

2. The charge pump of claim 1, wherein the at least one level translator further comprises:
a first level translator that monitors the output voltage of the current amplifier and self-adjusts a first bias point of a current source that sources the output current, wherein the first level translator increases the current sourcing in response to receiving an up pulse signal; and
a second level translator that monitors the output voltage of the charge pump and self-adjusts a second bias point of a current sink that sinks the output current, wherein the second level translator increases the current sinking in response to receiving a down pulse signal.

3. The charge pump of claim 1, wherein the current amplifier includes at least one bi-polar junction (BJT) transistor having a collector connected to the output voltage, a base connected to the at least one level translator, and an emitter tied to the current amplifier wherein the level translator senses a change in a base voltage when the output voltage at the collector exceeds the predetermined range.

4. The charge pump of claim 1, wherein the at least one level translator assesses a change in a base current due to the effects of the output current on output voltage, and updates the bias point to change the output current by adjusting a base voltage of a transistor coupled to the current amplifier.

5. The charge pump of claim 1, wherein the comparator includes a clocked latch that provides hysteresis, increases a gain of the comparator, and holds a state of the comparator to implement a bias scheme that changes in response to the charge pump output voltage.

6. A charge pump that supplies an output current to a voltage controlled oscillator of a phase locked loop and having an output voltage that varies in accordance with the output current, the charge pump comprising:
a differential current amplifier having:
a current source that sources current to the output current in response to a first bias point, the first bias point of the current source comprises a first bias applied to a base of a first Bi-Polar Junction (BJT) transistor, and a second bias applied to a base a second of Bi-Polar Junction (BJT) transistor, and
a current sink that sinks current form the output current in response to a second bias point, the second bias point of the current sink comprises a third bias applied to a base of a third Bi-Polar Junction (BJT) transistor, and a fourth bias applied to a base of a fourth Bi-Polar Junction (BJT) transistor;
a first level translator, coupled to the current source; and
a second level translator, coupled to the current sink.

7. The charge pump of claim 6, wherein the first level translator senses a start of a current source break down at a high output voltage, and the second level translator senses a start of a current sink break down at a low output voltage.

8. The charge pump of claim 6, wherein the charge pump keeps the output current constant between the higher range and the lower range.

9. The charge pump of claim 6, wherein
the current source includes the first bi-polar junction (BJT) transistor having a collector connected to the output voltage and having a base connected to the first level translator, wherein the first level translator senses a change in a base voltage when the output voltage exceeds the predetermined range due to sourcing the current high, and
the current sink includes the third bi-polar junction (BJT) transistor having a collector connected to the output voltage and having a base connected to the second level translator, wherein the second level translator senses a change in base voltage when the output voltage falls below the predetermined range due to sinking the current low.

10. The charge pump of claim 9, wherein a the first BJT and the third BJT increase an output impedance of the differential current amplifier due to a high input impedance of a BJT collector.

11. The charge pump of claim 10, wherein the first BJT and the third BJT detect when the output voltage exceeds the predetermined range without loading an output of the charge pump.

12. The charge pump of claim 6, wherein the first level translator senses a change in base current of the first BJT due to sourcing the output current too high, and raises a base voltage of the second BJT to extend the output voltage as high as an upper supply voltage of the charge pump before break down.

13. The charge pump of claim 6, wherein the second level translator senses a change in base current of the third BJT due to sourcing the output current too low, and raises a base voltage of the fourth BJT to extend the output voltage as low as a lower supply voltage of the charge pump before break down.

14. A phase locked loop, comprising
a phase detector that evaluates a phase and frequency error between a reference clock signal and a feedback divider signal and generates a timing signal consisting of up pulses and down pulses,
a charge pump coupled to the phase detector that receives the timing signal and generates an output current in accordance with the up pulses and down pulses, the charge pump comprising:
a current source that sources current to the output current in response to a first bias point,
a current sink that sinks current from the output current in response to a second bias point;
a first level translator, coupled to the current source, wherein the first level translator includes a first comparator that monitors a change in the first bias point by determining when a base voltage of a first transistor connected to the output voltage and the first level translator exceeds a first reference voltage; and
a second level translator, coupled to the current sink, wherein the second level translator includes a second comparator that monitors a change in the second bias point by determining when a base voltage of a second transistor connected to the output voltage and the second level translator falls below a second reference voltage;
a loop filter coupled to the charge pump that filters the output current and that generates an output voltage;
a voltage controlled oscillator coupled to the loop filter that receives the output voltage and generates an output clock signal having a phase and frequency of the reference clock signal; and a feedback divider coupled to the voltage controlled oscillator that produces the feedback divider signal from the output clock signal and provides the feedback divider signal to the phase detector.

15. The phase lock loop of claim 14, wherein the first level translator receives as input the first bias point and adjusts the first bias point to extend the output voltage to an upper supply voltage, and the second level translator receives as input the second bias point and adjusts the second bias point to extend the output voltage to a lower supply voltage of the charge pump to prevent charge pump break down.

16. The phase lock loop of claim 14, wherein the phase detector operates on a rising edge of the reference clock, and the first comparator and the second comparator operate on a falling edge of the reference clock to ensure that the first level translator and second level translator adjust the bias point only when the charge pump is not sourcing or sinking current.

* * * * *